(12) United States Patent
Kirn

(10) Patent No.: US 8,076,971 B2
(45) Date of Patent: *Dec. 13, 2011

(54) SAMPLING FREQUENCY REDUCTION FOR SWITCHING AMPLIFIERS

(75) Inventor: Larry Kirn, Austin, TX (US)

(73) Assignee: JM Electronics Ltd. LLC, Wilmington, DE (US)

( * ) Notice: Subject to any disclaimer, the term of this patent is extended or adjusted under 35 U.S.C. 154(b) by 52 days.

This patent is subject to a terminal disclaimer.

(21) Appl. No.: 12/524,843

(22) PCT Filed: Feb. 1, 2008

(86) PCT No.: PCT/US2008/052827
§ 371 (c)(1),
(2), (4) Date: Jul. 28, 2009

(87) PCT Pub. No.: WO2008/095173
PCT Pub. Date: Aug. 7, 2008

(65) Prior Publication Data
US 2010/0102881 A1    Apr. 29, 2010

Related U.S. Application Data

(60) Provisional application No. 60/887,662, filed on Feb. 1, 2007.

(51) Int. Cl.
*H03F 3/38* (2006.01)
(52) U.S. Cl. ............... 330/10; 330/251; 330/207 A
(58) Field of Classification Search ......... 330/10.207 A, 330/251
See application file for complete search history.

(56) References Cited

U.S. PATENT DOCUMENTS

| | | | |
|---|---|---|---|
| 5,559,467 A | 9/1996 | Smedley | |
| 5,663,647 A | 9/1997 | Wirth et al. | 324/322 |
| 6,031,746 A | 2/2000 | Steigerwald et al. | 363/71 |
| 6,150,880 A * | 11/2000 | Schweighofer | 330/207 A |
| 6,593,807 B2 | 7/2003 | Groves, Jr. et al. | 330/10 |
| 6,967,527 B2 * | 11/2005 | Fukushima | 330/10 |
| 2002/0001342 A1 | 1/2002 | Berkhout | |
| 2010/0001794 A1 | 1/2010 | Kirn | 330/10 |

FOREIGN PATENT DOCUMENTS

WO   WO 2006/106471 A1   10/2006
WO   WO 2008/095181 A1    8/2008

OTHER PUBLICATIONS

K. H. Edelmoser & F. A. Himmelstoss; "*High Dynamic Class-D Power Amplifier*"; Technical University Vienna, Power Electronics Section; Jun. 11, 1997; 1997 IEEE, pp. 302-303.
International Search Report dated Jul. 3, 2008 regarding PCT/US2008/052827.

* cited by examiner

*Primary Examiner* — Robert Pascal
*Assistant Examiner* — Khiem Nguyen
(74) *Attorney, Agent, or Firm* — Dorsey & Whitney LLP

(57) ABSTRACT

The present invention is directed toward providing a system and method of reducing RF interference in switching amplifiers without degrading performance. In one embodiment, the sampling rate of coarse high voltage modulated pulsewidths are decreased relative to the sampling rate of fine lower voltage modulated pulsewidths. This reduction in the sampling rate of coarse high voltage modulated pulsewidths results in a reduction in EMI. In addition, the higher sampling rate of the fine lower voltage modulated pulsewidths mitigates the distortion caused by the reduced sampling rate of the coarse pulsewidths.

23 Claims, 3 Drawing Sheets

SAMPLING FREQUENCY REDUCTION FOR SWITCHING AMPLIFIERS

CROSS-REFERENCE TO RELATED APPLICATION

This application claims the benefit of International Application No. PCT/US2008/052827, filed Feb. 1, 2008, which claims the benefit of U.S. Provisional Application No. 60/887,662, filed on Feb. 1, 2007. The entire disclosure of the prior applications are considered to be part of the disclosure of the instant application and are hereby incorporated by reference therein.

TECHNICAL FIELD

The invention is directed to switching amplifiers and methods, and more particularly, to a system and method for reducing the electromagnetic interference in switching amplifiers.

BACKGROUND OF THE INVENTION

Switching amplifiers enjoy significantly better efficiency than their non-switching predecessors, primarily because transistors used to switch voltages to a load are either turned ON, so that the voltage across the transistor is relatively low, or turned OFF, so that the current through the transistor is relatively low. With either a low voltage across the transistor or a low current through the transistor, the power dissipated by the transistor is relatively low.

Switching amplifiers using a single PWM stream are widely used. These switching amplifiers can sometimes generate excessive electromagnetic radio frequency ("RF") interference that can interfere with the operation of the amplifier as well as with other electronic devices in the vicinity of the amplifier. This RF interference can be attenuated to some extent by coupling the load driven by the amplifier to filters formed by inductors and/or capacitors. However, the remaining RF interference can still be too high in some applications. Other attempts to reduce RF interference using low cost solutions often results in distortion. For instance, reducing the sampling rate of a single PWM stream reduces RF interference, however, it also results in significant distortion, and therefore has not been a viable option. In addition, these switching amplifiers cannot accurately amplify high bandwidth, high accuracy signals at a reasonable cost.

A more recent approach has been to use switching amplifiers capable of using modulation techniques that include two or more PWM streams, such as a multi-reference switching amplifier. A multi-reference switching amplifier is described in U.S. Pat. No. 6,535,058 Multi-reference, High Accuracy Switching Amplifier, the entire content being incorporated herein by reference. One example of a multi-reference switching amplifier comprising two separate PWM streams where one stream is a coarse high voltage PWM stream and the other stream is a fine low voltage PWM stream. Although the multi-referenced switching amplifier resolved the need to amplify high bandwidth, high accuracy signals at a reasonable cost, there is a continued need for improving performance of multi-referenced switching amplifiers, such as reducing RF interference.

Reducing the sampling rate of multi-reference amplifiers by conventional methods, would also result in an increase in distortion to the output signal. In addition, reducing the sampling rate frequency can limit the bandwidth or frequency of the audio signal being amplified. Therefore, there is a need for a system and method for operating switching amplifiers in a manner that reduces electromagnetic RF interference without causing distortion and limiting the bandwidth or frequency of the output signal at a reasonable cost.

SUMMARY OF THE INVENTION

The present invention is directed to a system and method of reducing RF interference in a switching amplifier without causing distortion to an output signal. In one aspect of the invention, a switching device includes a first set of switching devices operable to be coupled to a first voltage and a second set of switching devices operable to be coupled to a second voltage. The switching amplifier further comprising a modulator configured to control the first set of switching devices at a first sampling rate and configured to control the second set of switching devices at a second sampling rate to provide first and second voltages to the load in accordance with the input signal, the first sampling rate lower than the second sampling rate.

DETAILED DESCRIPTION OF PREFERRED EMBODIMENTS

Embodiments of the present invention are directed toward providing a system and method of reducing RF interference in switching amplifiers without degrading performance. Certain details are set forth below to provide a sufficient understanding of the invention. However, it will be clear to one skilled in the art that the invention may be practiced without these particular details.

Figure 1:
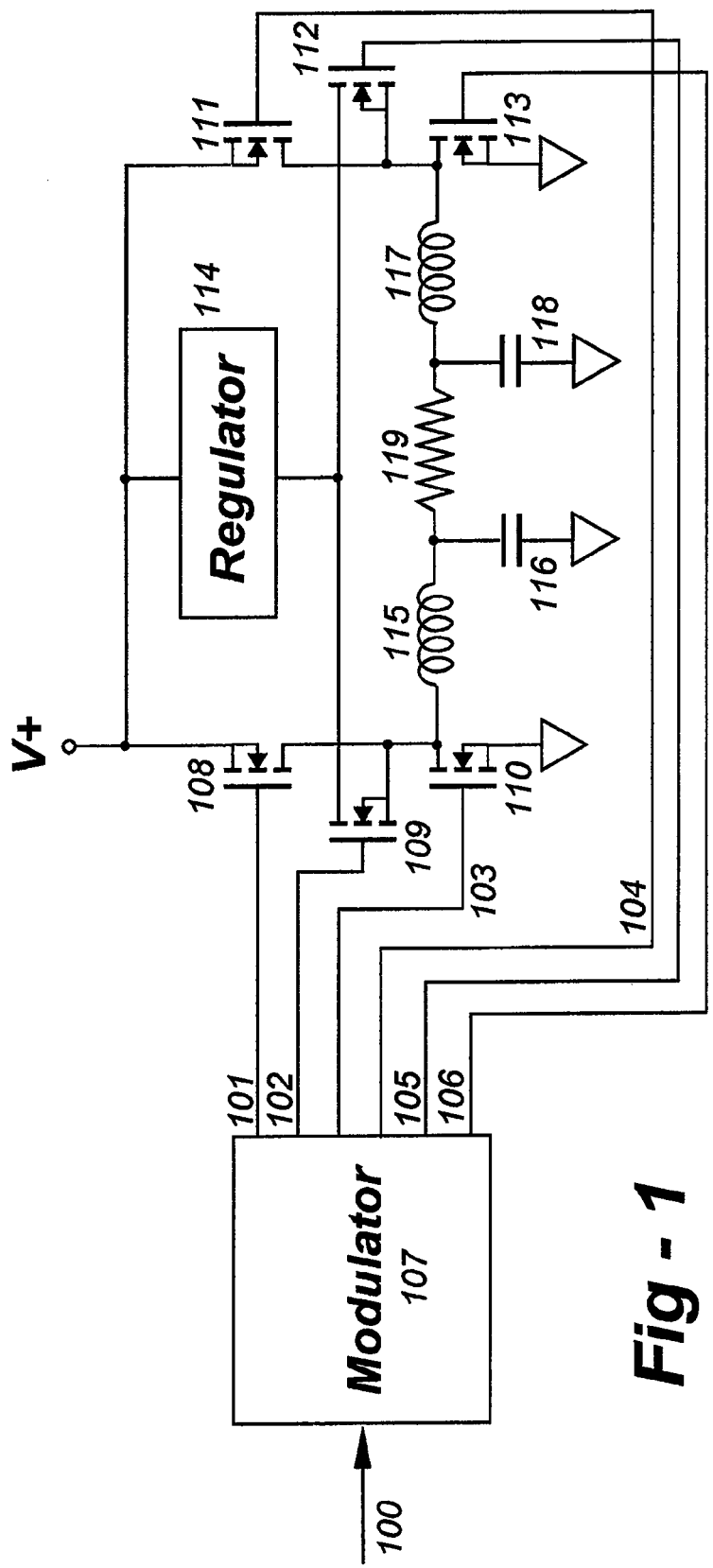
FIG. 1 is a block diagram of a typical multi-reference switching amplifier.

FIG. 1 is a block diagram of a dual reference switching amplifier. Although

FIG. 1 is directed to a dual reference switching amplifier, a person of ordinary skill in the art would appreciate that the invention applies to any multi-reference switching amplifier. The dual reference switching amplifier of FIG. 1 has two references, positive power supply voltage V+ and the voltage supplied from V+ by a regulator 114. Positive power supply voltage V+ supplies energy to a load 119 through control switches 108, 111. The regulator 114 supplies energy to the load 119 through switches 109, 112. Ground is provided to the load 119 through switching devices 110, 113. In some embodiments, the voltage supplied by the V+ reference is significantly greater than the voltage supplied by the regulator 114. For instance, in one embodiment, the voltage supplied by the positive power supply voltage V+ reference is approximately 12V, and the voltage supplied by the regulator 114 is 47 mV.

Input datastream 100 is applied as input to pulsewidth modulator (PWM) 107, which outputs PWM control signals 101, 102, 103, 104, 105, and 106 to control switching devices 108, 109, 110, 111, 112, and 113, respectively. The load 119 is connected in a bridge configuration across two independent output nodes. A first output node A is coupled to switching devices 108, 109, and 110. A second output node B is coupled to switching devices 111, 112, and 113. Therefore, switching devices 108 and 111 couple the positive power supply V+ to the load 119, and the switching devices 109 and 112 couple the reference voltage supplied from V+ by regulator 114 to the load 119, and switching devices 110 and 113 couple ground to the load 119. The circuit of FIG. 1 is described in further detail in U.S. Pat. No. 6,535,058 referenced above.

The circuit of FIG. 1 results in two separate PWM datastreams on each side of the load 119. In the embodiment shown in FIG. 1, the PWM datastream that is applied to the load 119 through switching devices 108, 111 is a coarse high voltage modulated stream. The pulse width modulated datastream that is applied to the load 119 through switching devices 109, 112 is a fine low voltage modulated stream. However, as will be apparent to a person of ordinary skill in the art, the configuration of the coarse and fine voltage stream is dependent upon which switching devices are coupled to the high voltage source and the low voltage source.

Figure 2:
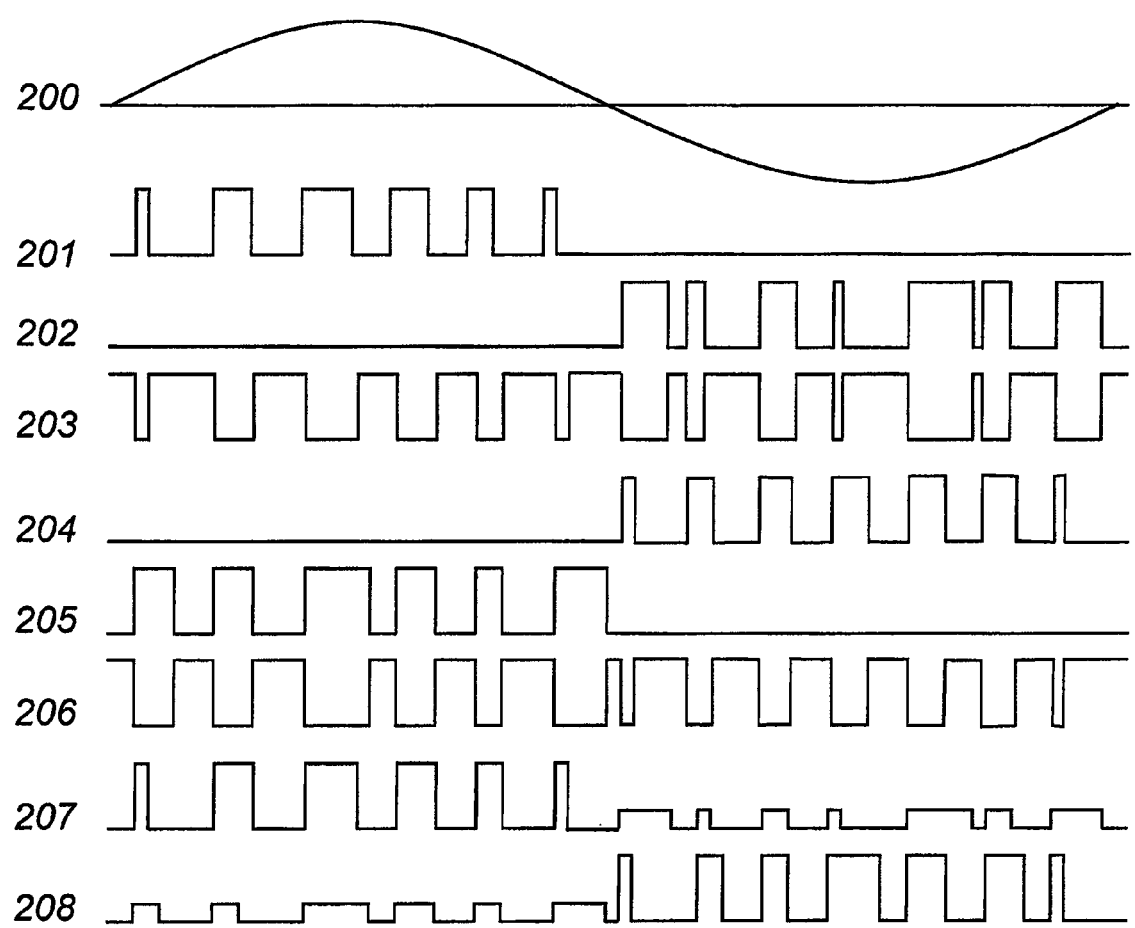
FIG. 2 shows the voltage waveforms typically seen in the circuit of FIG. 1 in accordance with prior art.

FIG. 2 shows the output voltage and current waveforms typically seen in the amplifier of FIG. 1 in accordance with prior art. Trace 200 shows the datastream 100 waveform of FIG. 1 to be amplified. Voltage traces 201, 202, 203, 204, 205, and 206 reflect the states of control signals 101, 102, 103, 104, 105, and 106 of FIG. 1, respectively, as the output polarity to the load 119 in FIG. 1 changes. Voltage trace 207 shows the collective outputs of switching devices 108, 109, and 110, as input to inductor 115 at first input node A. Voltage trace 208 shows the collective outputs of switching devices 111, 112, 113, as input to inductor 117 at second input node B.

As taught by the patent referenced above, note that the high-voltage V+ pulses modulated by coarse data in traces 207 and 208 follow the relative sign shown in trace 200, and that the reference voltage pulses modulated by fine data in traces 207 and 208 follow the opposing relative sign to V+ pulses shown in trace 200. Voltage traces 207 and 208 show that when the V+ pulses modulated by coarse data are applied to one side of the load 119, the reference voltage pulses modulated by fine data are applied to the other side of the load 119. For instance, when switching device 108 provides V+ pulses to the first input node A, switching device 112 provides reference voltage pulses to the second input node B. As is typically done in the prior art to maintain the same voltage on both sides of the load 110, the V+ coarse modulated and reference voltage fine modulated pulses shown in traces 207 and 208 occur at a common fixed output sampling rate.

Figure 3:
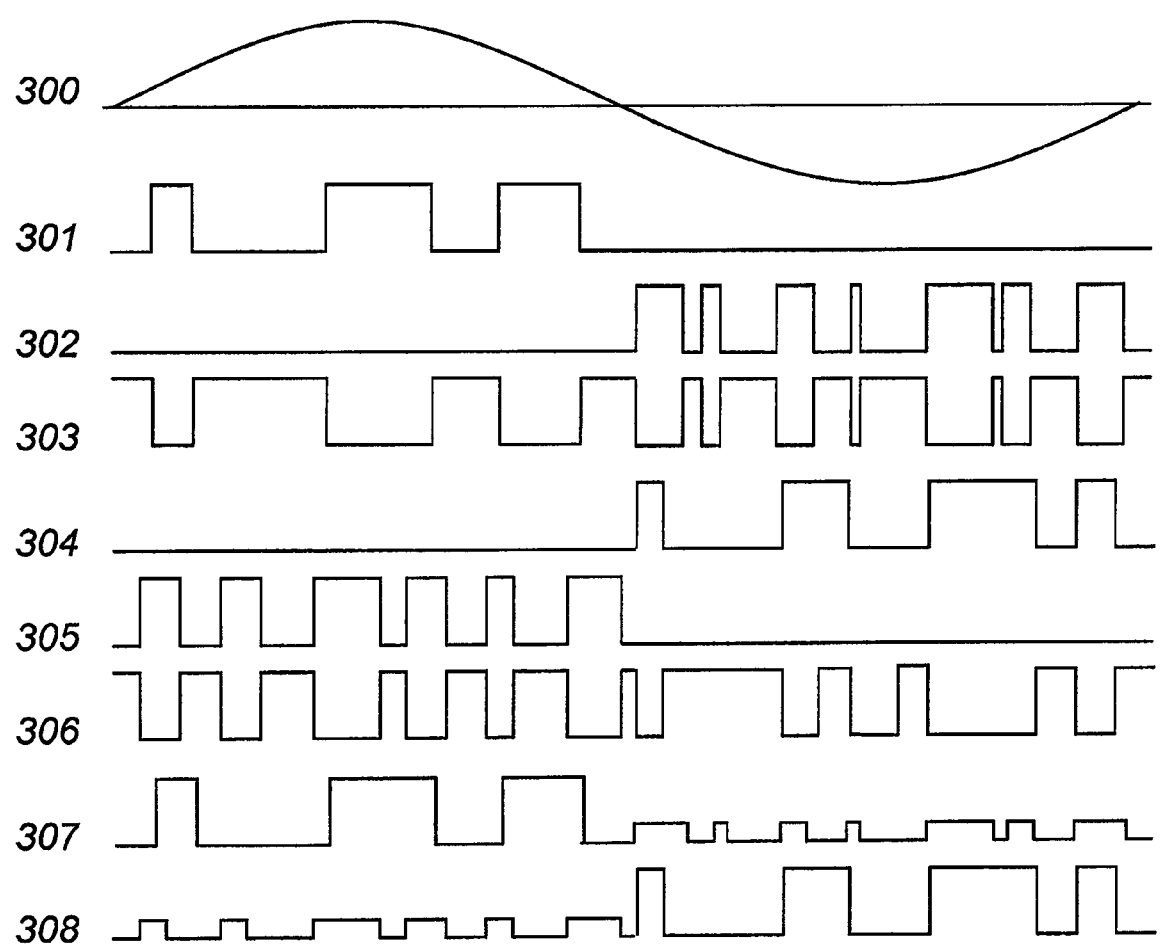
FIG. 3 shows the voltage waveforms of FIG. 1 according to one embodiment of the invention.

According to one embodiment of the invention, the switching amplifier of FIG. 1 is operated as shown in FIG. 3. Trace 300 shows the datastream 100 waveform of FIG. 1 to be amplified. Traces 301, 302, 303, 304, 305, and 306 show signals 101, 102, 103, 104, 105, 106 which control switching devices 108, 109, 110, 111, 112, 113, respectively. Trace 307 shows the collective outputs of switching devices 108, 109, and 110, as input to inductor 115. Trace 308 shows the collective outputs of switching devices 111, 112, 113, as input to inductor 117. Similar to that of FIG. 2, the V+ coarse modulated and the reference voltage fine modulated pulses in traces 307, 308 follow opposing signs of incoming waveform 300.

As stated above, reducing the sampling rate frequency results in a reduction in RF interference. Therefore, reducing the frequency of both the V+ coarse and reference voltage fine modulated pulses results in less RF interference, however, reducing the frequency of the coarse modulated pulses has a greater effect on reducing RF interference than reducing the frequency of the fine modulated pulses. Although reducing the coarse modulated pulses results in lower RF interference, it also introduces distortion to the output signal. However, by maintaining the fine modulated pulses at an acceptable frequency, such as the frequency used in the prior art, the fine modulated pulses lessens the impact of the distortion caused by the reduced frequency of the coarse modulated pulses. In addition, the fine modulated pulses provide a mechanism in which predictive distortion mitigation may be applied. This can be seen in traces 307 and 308 of FIG. 3, where the frequency of the V+ coarse modulated pulses are reduced to decrease RF interference and the fine modulated pulses remain at the same frequency of the pulses in FIG. 2. In summary, reducing the RF interference will not compromising performance. In addition, to reducing RF interference, reducing the sampling rate of the coarse signal, results in a low cost switching amplifier as it does not require expensive output filters, which are typically used with switching amplifiers. As will be apparent to those of ordinary skill in the art, the modulator 107 of FIG. 1 will likely require some increased complexity to adjust the sampling rate of the V+ pulses relative to the sampling rate of the reference voltage pulses.

In one embodiment of the invention, the coarse pulse duty cycle is not disturbed by the decrease in frequency. In FIG. 3, although the sampling rate of the coarse modulated pulses has decreased, the duty cycle has remained proportional the coarse modulated pulses in FIG. 2. For instance, the V+ coarse modulated pulses resultant of traces 307, 308 are twice as long and half as frequent as the V+ coarse modulated pulses in traces 207, 208 of FIG. 2. The resultant integrals of traces 307, 308 of FIG. 3 are therefore equivalent to the integrals of traces 207, 208 of FIG. 2, but the frequency of emissions are reduced by one half. Although FIG. 2 depicts the V+ coarse modulated pulses twice as long and reduced in frequency by one half, it will be clear to a person of ordinary skill in the art, the pulses may be lengthened and reduced by other amounts. However, in one embodiment the length and frequency of the coarse modulated signals will represent the same output signal to the load 119. As can be seen in traces 307, 308 the output sampling frequency of the reference voltage fine modulated pulses are undisturbed from those shown in FIG. 2. Therefore, the reference voltage fine modulated pulses are able to compensate for the distortion caused by decreasing the sampling rate as discussed above.

As will be apparent to a person of ordinary skill in the art, the voltage configuration in FIG. 1 may be of another configuration. For instance, in one embodiment, the V+power supply may be ground and the ground shown in FIG. 1 may be a negative voltage. Another embodiment, however, may include V+ in FIG. 1 as a negative voltage.

By the methods described herein, it can be seen that RF interference reduction of a multi-reference switching amplifier may be accomplished without compromising in-band performance.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

What is claimed is:

1. A switching amplifier, comprising:
   a first set of switching devices configured to be coupled to a first voltage source and further configured to be coupled to a load;
   a second set of switching devices configured to be coupled to a second voltage source and further configured to be coupled to the load;
   a third set of switching devices configured to be coupled to a third voltage source; and
   a modulator including an input terminal configured to receive an input signal and further including respective output terminals coupled to individual ones of the first, second, and third sets of switching devices, wherein the modulator is configured to control the first set of switching devices at a first sampling rate and further configured to control the second set of switching devices at a second sampling rate to couple the first and second voltage sources to the load in accordance with the input signal, and wherein the first sampling rate is lower than the second sampling rate.

2. The switching amplifier of claim 1, wherein the first set of switching devices are further configured to provide coarse control of power to the load and the second set of switching devices are further configured to provide fine control of power to the load.

3. The switching amplifier of claim 2, wherein duty cycles of the first and second sets of switching devices are determined, at least in part, by coarse and fine aspects of the input signal, respectively.

4. The switching amplifier of claim 1, wherein a first switching device from the first set of switching devices is configured to be coupled directly to a first terminal of the load and a first switching device from the second set of switching devices is configured to be coupled directly to a second terminal of the load.

5. The switching amplifier of claim 3, wherein the modulator is further configured to control the first set of switching devices at the first sampling rate that is one half the second sampling rate of the second set of switching devices.

6. The switching amplifier of claim 1, wherein the first voltage source is configured to provide a first voltage, and wherein the first voltage is greater than a second voltage configured to be provided by the second voltage source.

7. The switching amplifier of claim 1, wherein the third set of switching devices is further configured to provide a default voltage state to the load.

8. The switching amplifier of claim 1, wherein the load is a speaker.

9. A switching amplifier, comprising:
first, second, and third reference voltage sources;
a first set of control switches, wherein each control switch of the first set is coupled to a respective one of the reference voltage sources and further coupled to a first output node;
a second set of control switches, wherein each control switch of the second set is coupled to a respective one of the reference voltage sources and further coupled to a second output node; and
a modulator including:
an input terminal configured to receive an input signal;
a first plurality of output terminals coupled to respective ones of the first set of control switches; and
a second plurality of output terminals coupled to respective ones of the second set of control switches, wherein the modulator is configured to generate a plurality of control signals for the first and second sets of control switches in response to the input signal, and wherein the plurality of control signals are configured to activate the control switches coupled to the first reference voltage source at a lower frequency than the control switches coupled to the second reference voltage source.

10. The switching amplifier of claim 9, wherein the control switches coupled to the first reference voltage source are further configured to provide coarse control of power to the first output node and the second output node, and wherein the control switches coupled to the second reference voltage source are further configured to provide fine control of power to the first output node and the second output node.

11. The switching amplifier of claim 10, wherein the control switches coupled to the first reference voltage source are further configured to provide pulses of the first reference voltage source, and wherein the lower frequency results in a reduction of electromagnetic interference without causing significant distortion to an output signal.

12. The switching amplifier of claim 9, wherein a first control switch and a second control switch in the first set of control switches are coupled to the first output node, and wherein a first control switch and a second control switch in the second set of controls switches are coupled to the second output node.

13. The switching amplifier of claim 9, wherein fine modulation is configured to provide predictive distortion removal of distortion caused by the lower frequency.

14. The switching amplifier of claim 9, wherein duty cycles of the first and second sets of switching devices are determined by coarse and fine aspects of the input signal.

15. A method of operating a switching amplifier, the method comprising:
receiving an input signal at an input terminal of the switching amplifier;
applying a plurality of first pulsewidth-modulated voltage pulses to a first output of the switching amplifier during a first period of time; and
applying a plurality of second pulsewidth-modulated voltage pulses to a second output of the switching amplifier during the first period of time, wherein a voltage of the first pulsewidth-modulated voltage pulses is greater than a voltage of the second pulsewidth-modulated voltage pulses, and wherein the first pulsewidth-modulated voltage pulses are applied to the first output at a lower frequency than the second pulsewidth-modulated voltage pulses are applied to the second output.

16. The method of claim 15, further comprising:
applying a plurality of third pulsewdith-modulated voltage pulses to the first output of the switching amplifier during a second period of time; and
applying a plurality of fourth pulsewidth-modulated voltage pulses to the second output of the switching amplifier during the second period of time, wherein a voltage of the fourth pulsewidth-modulated voltage pulses is higher than a voltage of third pulsewidth-modulated voltage pulses, and wherein the fourth pulsewidth-modulated voltage pulses are applied to the second output at a lower frequency than the third pulsewidth-modulated voltage pulses are applied to the first output.

17. The method of claim 15, wherein the first pulsewidth-modulated voltage pulses provide coarse control of power delivery to the output of the switching amplifier, and wherein the second pulsewidth-modulated voltage pulses provide fine control of power delivery to the output of the switching amplifier.

18. The method of claim 15, wherein the second pulsewidth-modulated voltage pulses provide predictive distortion removal of distortion caused by the lower frequency.

19. The method of claim 15, wherein duty cycles of the first and second sets of switching devices are determined by coarse and fine aspects of the input signal.

20. A system, comprising
a load; and
a switching amplifier, including:
a first set of switching devices configured to be coupled to a first voltage source and further configured to be coupled to the load;

a second set of switching devices configured to be coupled to a second voltage source and further configured to be coupled to the load;

a third set of switching devices configured to be coupled to a third voltage source; and a modulator comprising:

an input terminal configured to receive an input signal; and respective output terminals coupled to the each of the switching devices, wherein the modulator is configured to control the first set of switching devices at a first sampling rate and further configured to control the second set of switching devices at a second sampling rate to provide first and second voltages to the load in accordance with the input signal, and wherein the first sampling rate is lower than the second sampling rate.

21. The system of claim 20, wherein the load is a speaker.

22. The system of claim 20, wherein the first set of switching devices provide a coarse control of power to the load, and wherein the second set of switching devices provide a fine control of power to the load.

23. The system of claim 20, wherein the first sampling rate is one half the second sampling rate.

* * * * *